United States Patent
Mcsporran

(10) Patent No.: US 9,793,420 B2
(45) Date of Patent: Oct. 17, 2017

(54) GROWTH LAYER FOR PHOTOVOLTAIC APPLICATIONS

(75) Inventor: Neil Mcsporran, Perrysburg, OH (US)

(73) Assignee: Pilkington Group Limited, Lathom (GB)

( * ) Notice: Subject to any disclaimer, the term of this patent is extended or adjusted under 35 U.S.C. 154(b) by 628 days.

(21) Appl. No.: 13/261,697

(22) PCT Filed: Feb. 3, 2012

(86) PCT No.: PCT/GB2012/050243
§ 371 (c)(1),
(2), (4) Date: Jul. 25, 2013

(87) PCT Pub. No.: WO2012/104656
PCT Pub. Date: Aug. 9, 2012

(65) Prior Publication Data
US 2013/0306142 A1    Nov. 21, 2013

(30) Foreign Application Priority Data
Feb. 4, 2011   (GB) .................... 1101910.6

(51) Int. Cl.
B32B 15/04    (2006.01)
B32B 17/06    (2006.01)
H01L 31/02    (2006.01)
H01L 31/032   (2006.01)
H01L 31/0392  (2006.01)
H01L 31/0749  (2012.01)

(52) U.S. Cl.
CPC .... *H01L 31/02021* (2013.01); *H01L 31/0322* (2013.01); *H01L 31/03923* (2013.01); *H01L 31/0749* (2013.01); *Y02E 10/541* (2013.01); *Y10T 428/265* (2015.01)

(58) Field of Classification Search
USPC ....... 428/426, 428, 432, 434, 688, 689, 701, 428/702
See application file for complete search history.

(56) References Cited

U.S. PATENT DOCUMENTS

| | | | | |
|---|---|---|---|---|
| 5,570,212 A | * | 10/1996 | Steigerwald | G02F 1/133512 349/106 |
| 2001/0028062 A1 | * | 10/2001 | Uemura | H01L 33/0095 257/79 |
| 2004/0144419 A1 | * | 7/2004 | Fix | H01L 31/022425 136/252 |

(Continued)

FOREIGN PATENT DOCUMENTS

WO   WO-2010063973    *   6/2010
WO   2010/141461 A1       12/2010
WO   2010/141463 A1       12/2010

OTHER PUBLICATIONS

Barreau et al, Influence of Mo[110] textureation on co-evaporated CIGSe layers and related sola cells, Sep. 2010, Proceddign of EUPVSEC.*

(Continued)

*Primary Examiner* — Lauren R Colgan
(74) *Attorney, Agent, or Firm* — Marshall & Melhorn, LLC

(57) ABSTRACT

Sputtered zinc oxide layer is used to improve and control the crystalline properties of a molybdenum back contact used in photovoltaic cells. Optimum thicknesses for the zinc oxide layer are identified.

32 Claims, 7 Drawing Sheets

(56) References Cited

U.S. PATENT DOCUMENTS

| | | | |
|---|---|---|---|
| 2009/0133749 A1* | 5/2009 | Yonezawa | H01L 31/0322 136/256 |
| 2010/0307561 A1 | 12/2010 | Buller et al. | |
| 2010/0326491 A1 | 12/2010 | Cheng et al. | |
| 2011/0088774 A1* | 4/2011 | Gromball | C03C 17/36 136/256 |
| 2011/0188125 A1* | 8/2011 | Takenaka | G02B 5/124 359/634 |
| 2011/0297988 A1* | 12/2011 | Domercq | C03C 17/36 257/98 |
| 2012/0048364 A1* | 3/2012 | Auvray | H01L 31/02168 136/256 |
| 2012/0177900 A1* | 7/2012 | Laurent | B32B 17/10036 428/213 |
| 2013/0112255 A1* | 5/2013 | McSporran | C03C 17/36 136/256 |

OTHER PUBLICATIONS

John H. Scofield et al; Sputtered molybdenum bilayer back contact for copper indium diselenide-based polycrystalline thin-film solar cells; Thin Solid Films, 1995, pp. 26-31; vol. 260; Elsevier-Science S.A.

Miguel A. Contreras et al; Texture manipulation of CuInSe2 thin films; Thin Solid Films; Feb. 1, 2000; pp. 167-171; vol. 361-362; No. 1; Elsevier-Sequoia S.A., Lausanne, Switzerland; XP004187464.

Neelkanth G. Dhere, CIGSS Thin Film Solar Cells; Jul. 21, 2003; NREL Report No. FSEC-CR-1416-2003; Year 2, Quarter 3 Report; National; Renewable Energy Laboratory; Golden, Colorado USA.

L. Assmann et al; Study of the Mo thin films and Mo/CIGS interface properties; Applied Surface Science; 2005; pp. 159-166; vol. 246; Elsevier B.V.

Susanne Siebentritt et al; The electronic structure of chalcopyrites—bands, point defects and grain boundaries; Progress in Photovoltaics: Research and Applications; Apr. 15, 2010; pp. 390-410; vol. 18; published online in Wiley Online Library; John Wiley & Sons, Ltd.

Jonas Hedström et al; ZnO/CdS/Cu(In,Ga)Se2 Thin Film Solar Cells with Improved Performance; 23rd IEEE Photovoltaic Specialists Conference; 1993; pp. 364-371.

Shigeru Niki et al; CIGS absorbers and processes; Progress in Photovoltaics: Research and Applications; Aug. 4, 2010; pp. 453-466; vol. 18; published online in Wiley Online Library; John Wiley & Sons, Ltd.

Neelkanth G. Dhere; Scale-up Issues of CIGS thin film PV modules; Solar Energy Materials & Solar Cells; 2010; Elsevier B.V.

N. Barreau and P. Bommersback; Influence of the Mo [110] Texturation on Co-Evaporated CIGSe Layers and Related Solar Cells; Proceeding of UPVSEC, 25th European Photovoltaic Solar Energy Conference and Exhibition/5th World Conference on Photovoltaic Energy Conversion; Sep. 10, 2010; DOI: 10.4229/25th EUPVSEC2010-3BV.2.23; Valencia, Spain; XP002692137 (also cited in the International Search Report of the corresponding international application).

Ju-Heon Yoon et al.; Effect of the Mo back contact microstructure on the preferred orientation of CIGS thin films; 35th IEEE Potovoltaic Specialists Conference (PVSC); Honolulu, Haiwaii, USA; Jun. 20-25, 2010; pp. 2443-2447; IEEE, Piscataway, NJ, USA; XP031783985.

Eigo Takahashi et al.; Correlation between preparation parameters and properties of molybdenum back contact layer for CIGS thin film solar cell; 35th IEEE Potovoltaic Specialists Conference (PVSC); Honolulu, Haiwaii, USA; Jun. 20-25, 2010, pp. 2478-2482; IEEE; Piscataway, NJ, USA; XP031784444.

A. Slobodskyy et al.; In-depth analysis of the CuIn1—xGaxSe2 film for solar cells, structural and optical characterization; Applied Physics Letters; Dec. 23, 2010; pp. 251911-251911; vol. 97; No. 25; AIP, American Institute of Physics; Melville, NY, US; XP012138206.

* cited by examiner

Intensities:

|  | Psi | Phi | Intensity |
|---|---|---|---|
| Min | 85.0 | 157.5 | 2.0 |
| Max | 0.0 | 292.5 | 225.8 |

Strength = 45%

Intensities:

|  | Psi | Phi | Intensity |
|---|---|---|---|
| Min | 85.0 | 7.5 | 0.2 |
| Max | 0.0 | 12.5 | 6329.7 |

Strength = 96.7%

GROWTH LAYER FOR PHOTOVOLTAIC APPLICATIONS

BACKGROUND OF THE INVENTION

The invention is concerned with photovoltaic devices, particularly with improving the quality of molybdenum contacts used in such devices.

The use of photovoltaic cells for the generation of electrical energy is well known. The cells contain semiconductor materials exhibiting the photovoltaic effect and these are typically realised in solar panels comprising a number of cells. Solar energy represents a clean, environmentally friendly source of electricity and, although at present it accounts for a small fraction of global energy consumption, it is also a rapidly expanding industry. Of the thin film photovoltaic technologies in mass production at this time, $CuIn_{1-x}Ga_xSe_{2-y}Sy$ (CIGS) and $CuInS_2$ (CIS) have demonstrated the highest efficiencies. It is generally accepted that as device efficiencies increase to high levels, incremental improvements become of greater importance.

Molybdenum is used for the back contact in CIGS/CIS cells due to its excellent adhesion and low contact resistance with the materials concerned. Molybdenum is also inert and stable during the aggressive CIGS deposition process.

Additionally an intermediate $MoSe_2$ layer is formed during CIGS deposition, which provides an ohmic contact between the absorber and the back contact. Therefore the main focus when depositing Mo has been on providing a material with low sheet resistance and good adhesion. In order to achieve both of these properties it has been shown by Scofield et al, that deposition of a Mo bi-layer is necessary (Scofield et al, *Thin Solid Films*, 260, (1995), 26.). This involves deposition of a high pressure Mo layer to give a well adhered film under tensile stress, followed by deposition of a Mo layer at lower pressure to give low sheet resistance (this film is under compressive stress).

Attainment of CIGS material of the desired texture for highly efficient devices is heavily dependent on the structural properties of the Mo layer (Contreras et al, *Thin Solid Films*, 361-362, (2000), 167.). Properties such as morphology, grain size, and stress state are variables that are likely to affect the CIGS nucleation and growth process. Work by NREL demonstrated that it was desirable for the Mo to be crystalline and in the (110) orientation, the so-called "fish-like" morphology (Dhere, NREL report, FSEC CR1416-03, (2003)). Work by Assmann et at confirms this (Assmann et al, *Applied Surface Science*, 246, (2005), 159.).

As CIGS devices are grown in the substrate configuration, the Mo effectively serves as a growth layer for the rest of the device and so a high quality Mo layer is essential to achieve high efficiency devices. Improvement of the (110) orientation of the Mo and the ability to control its crystalline structure without adversely affecting other properties would represent significant advances in the art. This ability allows for tuning of the Mo layer properties to device requirements, which is important as small variations in the crystalline structure of CIGS can strongly affect the series resistance and the fill factor of devices (Siebentritt et al, *Prog Photovolt Res & Apps*, 18, (2010), 390.). Furthermore it is likely that for different CIGS deposition processes, the optimum Mo texture is likely to be different and so being able to tailor morphology for an individual process is important.

One final function that Mo can perform is in the control of sodium diffusion into the CIGS material. In order to obtain the highest efficiency devices, the presence of sodium is necessary when the CIGS material is deposited (Hedström et al., *Proc. of the 23rd IEEE Photovoltaic Specialists Conference*, (1993), 364., Niki et al., *Prog. Photovolt: Res. Appl.*, 18, (2010), 453.). In laboratory cells this sodium is generally supplied by diffusion from a soda lime glass substrate, through the Mo layer and into the CIGS material. Therefore the microstructure of the Mo can be tailored to control this sodium diffusion. However for an industrial process, close control of sodium content is essential to achieve consistent high performance and efficiency and so relying on diffusion from the glass would be considered difficult. Sodium content and mobility in glass can vary depending on glass origin, composition, age and storage conditions. To prevent uncontrolled sodium diffusion from the glass, a sodium barrier layer is used between the glass and the molybdenum coating. Sodium can then be introduced in a controlled manner via deposition of a sodium compound, such as sodium fluoride (N. G. Dhere, *Solar Energy Materials and Solar Cells*, 95, (2011), 277.). Examples of common sodium barrier layers would be $SiO_2$ or SiN. When using barrier layers to restrict sodium diffusion it is desirable that Mo is grown with a densely packed grain structure to give greater protection from uncontrolled Na diffusion and with as few pinholes as possible, i.e. a high quality film is needed.

Control of Mo growth can be achieved by varying the deposition parameters; however this invariably changes other properties of the material. A means of enhancing the orientation of the material without affecting other properties would therefore be desirable. As mentioned previously, for high efficiency CIGS devices the Mo should be in the (110) orientation. By the invention, this (110) orientation is enhanced and can be tuned as desired.

Barreau and Bommersback (Proceeding of EUPVSEC, Valencia, (2010), 3BV.2.23) discuss the improvement of Mo orientation by using ZnO, however they use rather thick layers >100 nm to improve growth. According to this disclosure, increasing the ZnO thickness from 0 to 50 nm, gives an increase in the intensity of the (110) signal by a factor of ~1.5. A further increase to 150 nm ZnO leads to a 3-fold increase after which the effect levels off. Overall the ZnO layer gives a 4.5-fold increase in (110) intensity. No data is presented concerning ZnO layers having a thickness between 0 and 50 nm. The implication is that the data obtained for other thicknesses may be extrapolated over this range.

SUMMARY OF THE INVENTION

According to the invention, a method of controlling the crystal orientation of a molybdenum layer on a substrate comprises the steps set out in claim 1 attached hereto.

Throughout the following description of the invention, references to ZnO include reference to materials having a substantial fraction of their composition comprised of ZnO. For example, reference to ZnO includes material commonly represented as ZnO:Al—a material comprising largely ZnO but including some Al. Layers of such materials may be deposited by sputter coating using commercially available target materials.

The inventors have also shown that an additional primer layer may be included with deposition of the ZnO layer being done directly thereon. This assists growth of the ZnO layer. The primer layer may comprise, for example $ZnSnO_x$ or $TiO_2$. Preferably the primer layer has a thickness of between 5 and 50 nm.

In various embodiments, the substrate may be formed in glass; metal such as stainless steel or polymer.

A preferred material for the substrate is glass, in which case a sodium barrier layer may be included, between the glass and any other layer. Preferably, the barrier layer comprises at least one of $Si_xN_y$, $SiO_2$, $SnO_2$, SiCO and $TiO_2$.

Where the barrier layer is $SiO_2$, preferably 8 nm<t<30 nm, more preferably 12 nm<t<18 nm.

Where the barrier layer comprises a layer of $Si_xN_y$, preferably 0 nm<t<30 nm, more preferably 0 nm<t<15 nm, most preferably 2 nm<t<8 nm.

The barrier layer may have a thickness of between 5 and 200 nm and may be deposited by chemical vapour deposition.

The primer layer may be $ZnSnO_x$ having a thickness of between 5 and 30 nm.

According to a second aspect of the invention, a substrate comprises the features set out in claim 19 attached hereto.

The substrate may further comprise an additional primer with the ZnO layer being located thereon. The primer layer may comprise, for example $ZnSnO_x$ or $TiO_2$. The primer layer preferably has a thickness of between 5 and 50 nm.

The substrate may be comprised of glass, in which case a sodium barrier layer may be located between the substrate and the other layer or layers.

Preferably, the barrier layer comprises at least one of: $Si_xN_y$, $SiO_2$, $SnO_2$, SiCO and $TiO_2$.

Where the barrier layer comprises $SiO_2$, preferably 8 nm<t<30 nm, more preferably 12 nm<t<18 nm.

Where the barrier layer comprises $Si_xN_y$, preferably 0 nm<t<30 nm, more preferably 0 nm<t<15 nm, most preferably 2 nm<t<8 nm.

The barrier layer may have a thickness of between 5 and 200 nm.

The primer layer may comprise $ZnSnO_x$ having a thickness of between 5 and 30 nm.

A substrate according to the invention is preferably incorporated in a photovoltaic cell.

The inventors have shown that, contrary to previous teaching, the Mo crystallinity and (110) presence may be enhanced by use of thin ZnO layers. X-ray diffraction (XRD) studies have shown an increase in the intensity of the (110) reflection by up to 60 times when using thin ZnO layers. Moreover the ZnO thickness can be used to tune the Mo to the required orientation.

BRIEF DESCRIPTION OF THE DRAWINGS

The invention will now be described, by non-limiting example, with reference to the following figures in which.

DETAILED DESCRIPTION OF THE INVENTION

Figure 1:
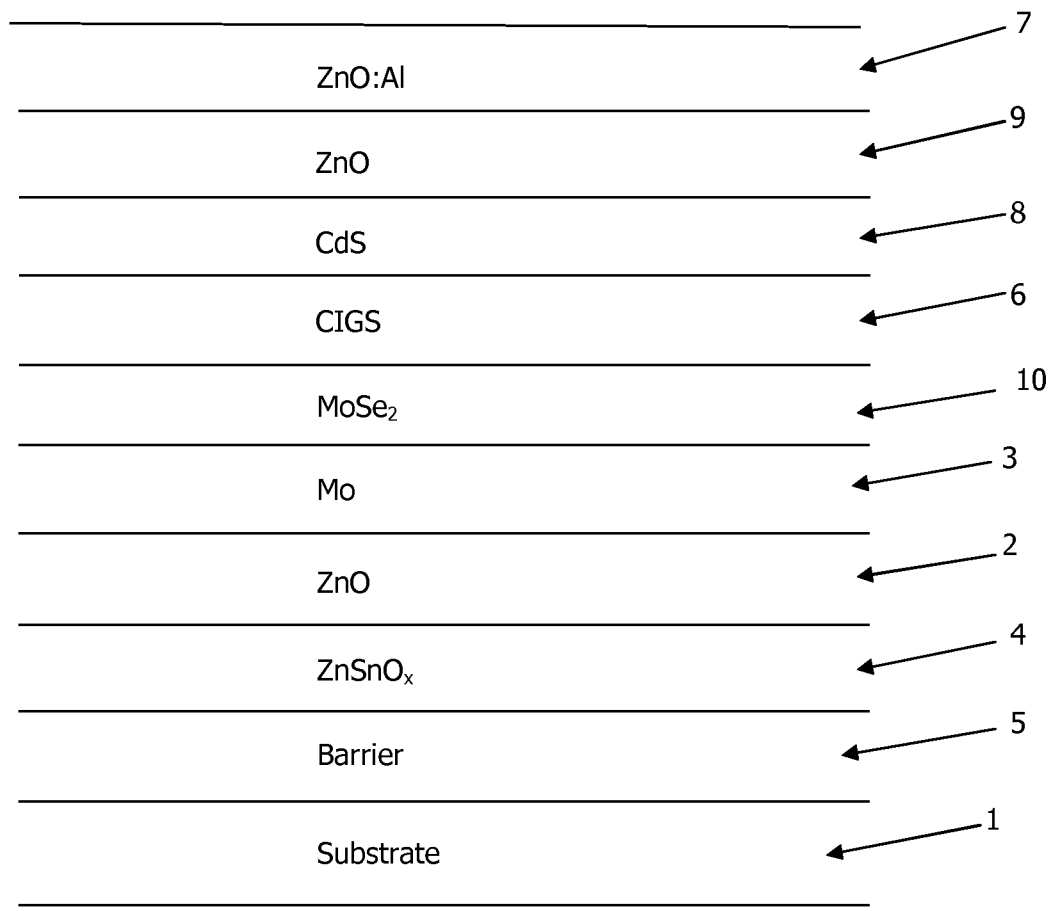
FIG. 1 is a schematic representation of a photovoltaic device according to the invention.

Referring to FIG. 1, according to the invention a substrate 1 is processed by deposition of a ZnO layer 2 and a Mo layer 3. As will be shown below, the morphology and crystal structure on the Mo layer 3 is heavily dependent on the thickness of the ZnO layer 2 and this thickness is selected according to the desired characteristics of the Mo layer 3.

A stack having only the ZnO layer 2 between the substrate and the Mo layer 3 represents the simplest embodiment of the invention. However, the quality of the ZnO layer 2 (and the extent of its effect on the characteristics of the Mo layer 3) is enhanced by inclusion of a primer layer 4 of, for example $ZnSnO_x$, located between the substrate 1 and the ZnO layer 2.

Moreover, while the invention has applicability to substrates of a range of materials, a preferred material is glass. Where a glass substrate is used, a sodium barrier layer 5 may also be included.

Preferably, the substrate thus processed is incorporated in a photovoltaic cell by further including a photoactive region 6 comprising $CuIn_{1-x}Ga_xSe_{2-y}Sy$ or $CuInS_2$ which forms a heterojunction with an Al doped ZnO layer 7, typically buffered by a thin layer 8 of CdS and a layer 9 of intrinsic ZnO. As previously noted, a layer of $MoSe_2$ 10 may be included between the Mo layer 3 and the photoactive region 6 in order to provide an improved ohmic contact.

Thicknesses illustrated in FIG. 1 are not to scale.

EXAMPLES

In the following examples, Molybdenum growth was carried out by sputtering a molybdenum target in Argon gas and the deposited films had a thickness of 500 nm unless otherwise stated. At 500 nm, sheet resistance was ~0.3Ω/□ and films were durable, surviving the scotch tape test. As discussed previously, the stress of the films could be controlled through use of deposition pressure.

The examples involve deposition of layers on a float glass substrate but this feature should not be seen as limiting. The invention has applicability where molybdenum is provided on any substrate (including other types of glass and other materials such as metals or polymers) and where the crystal orientation/morphology of the molybdenum layer is important.

Examples 1 and 2

Two Mo films, having thicknesses of 500 nm and 1000 nm (examples 1 and 2 respectively) were grown on soda-lime-silica glass substrates (referred to below as "float"). Since both films were deposited under the same deposition conditions, the crystalline orientation of the films is similar and a doubling in thickness results in an increase in the XRD intensity by a factor of around two in line with expectations.

Figure 2:
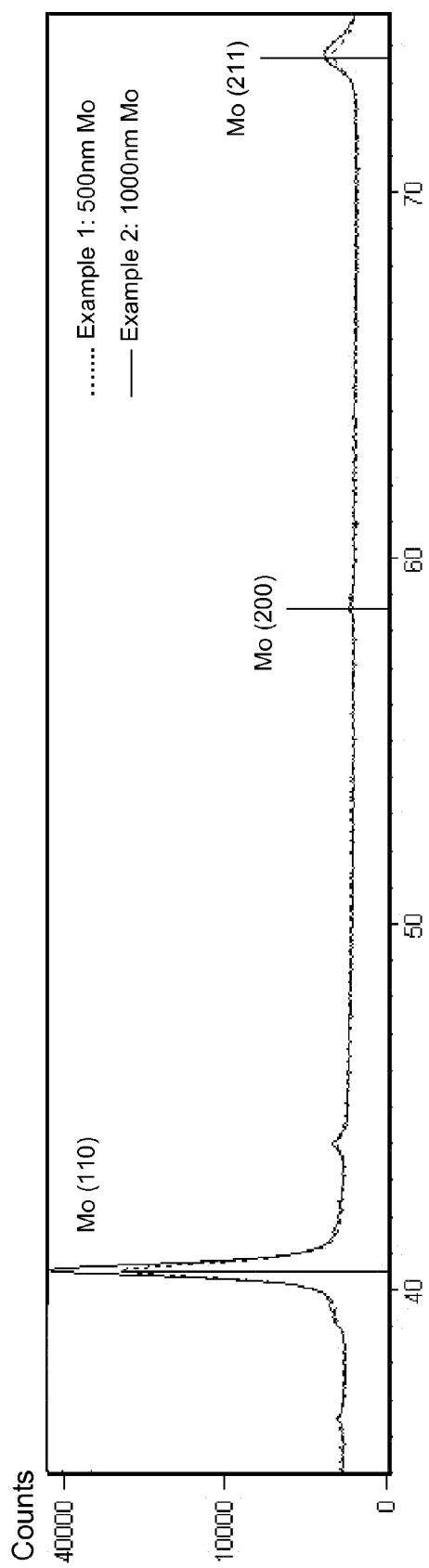
FIG. 2 shows an X-Ray Diffraction (XRD) pattern obtained from samples of Mo layers grown on glass substrates, the Mo layers having thicknesses of 500 nm and 100 nm respectively.

The X-Ray Diffraction patterns for the examples 1 and 2 are shown in FIG. 2 as solid lines and broken lines respectively. For the major part of the graph, the two lines are difficult to distinguish as the XRD intensity is similar. As can be seen however, the (110) orientation of the films is dominant (indicating that these films would be suitable for use in CIGS devices) and the XRD intensity in this region of the graph is for the 500 nm sample is approximately double that for the 1000 nm sample.

Examples 3 to 7

Growth of Mo on a variety of barrier layers was explored. A 500 nm Mo layer was grown on each of the examples described in table 1. Figures in parenthesis indicate the thickness of the preceding layer in nm. Samples were subjected to XRD analysis of the Mo layer and the results are summarised. C in strain indicates compressive stress and T tensile stress.

TABLE 1

Selected properties of Mo layers on different substrates from XRD analysis

| Example | Description | (110) Intensity | Crystallite size (nm) | Strain in Film (%) |
|---|---|---|---|---|
| 1 | Float | 17 | 30 | 0.17C |
| 3 | Float./$Si_xN_y$(50) | 15 | 32 | 0.13C |
| 4 | Float/SiO2 (30) | 16 | 31 | 0.23C |
| 5 | Float/SnO2 (25)/ SiO2 (25) | 13 | 31 | 0.17C |
| 6 | Float/SiCO (40) | 16 | 34 | 0.23C |
| 7 | Float/SiO2 (30)/ TiO2 (15) | 15 | 35 | 0.20C |

The data shown in table 1 indicates that Mo growth on all of these substrates is quite similar.

Examples 8 and 9

Further samples comprising a thin ZnO growth layer were prepared. Example 8 comprised a ZnO layer on the $SiO_2$ barrier layer. Example 9 was similar to example 8 but further included a $ZnSnO_x$ primer layer on the barrier layer to improve the ZnO growth.

Table 2 summarises these sample structures (including the float/SiO2 example shown in table 1 for ease of comparison) and shows the results of XRD analysis.

TABLE

Selected properties of Mo layers grown on ZnO with and without primer layer

| Example | Description | (110) Intensity | Crystallite size (nm) | Strain in Film (%) |
|---|---|---|---|---|
| 4 | Float/SiO2 (30) | 16 | 31 | 0.23C |
| 8 | Float/SiO2 (30)/ ZnO (8) | 520 | 31 | 0.08C |
| 9 | Float/SiO2 (30)/ $ZnSnO_x$) (10)/ZnO (8) | 1044 | 30 | 0.05C |

Figure 3:
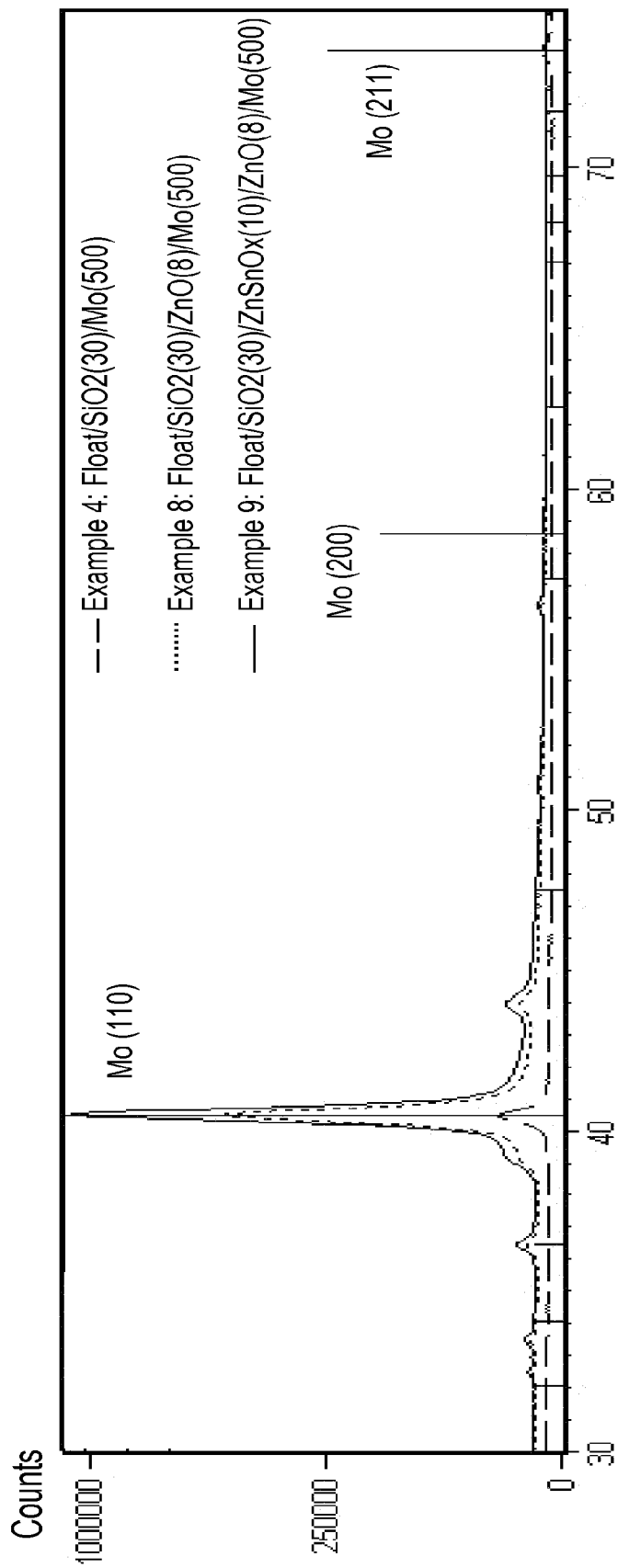
FIG. 3 shows a comparison of XRD data obtained from samples of Mo grown on a glass substrates having a sodium barrier layer and samples having the same barrier layer along with various realisations of a ZnO growth layer according to the invention.

FIG. 3 further illustrates the respective degrees of (110) orientation exhibited by the samples having a ZnO growth layer.

As can be seen from table 2 and FIG. 3, the crystallinity of the samples has improved considerably with the signal for the preferred (110) orientation increasing by a factor of around 65. Sheet resistance of the Mo films was ~0.3Ω/□ and all samples passed the Scotch tape test, confirming that durability had not been compromised. In addition, this effect was observed on Mo deposited over a range of pressures.

Table 2 shows a marked improvement in the properties of Mo grown on ZnO and a further marked improvement when the ZnO is grown on a primer layer.

Texture measurement is a technique that provides a measure of the strength of the columnar orientation of a sample. By this procedure, the angular distribution of a selected hkl plane is measured.

Figure 4:
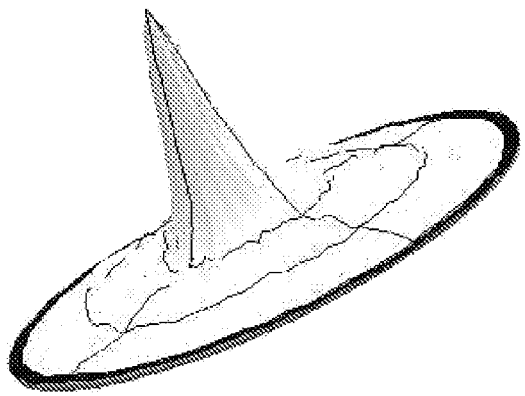
FIGS. 4 and 5 shows a comparison of texture measurement data obtained for Mo layers produced according to the prior art and Mo layers produced on ZnO growth layers according to the invention.
Figure 5:
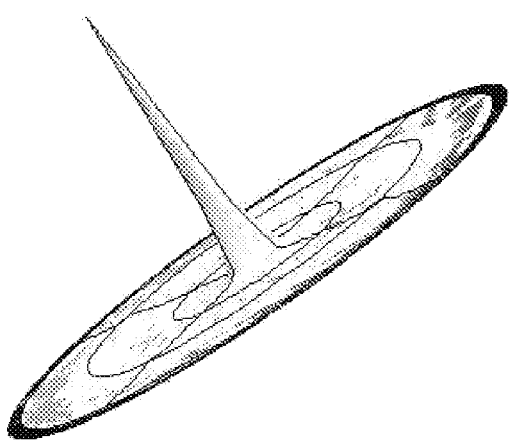

Texture measurement was performed on Mo layers grown on Float glass and on a Barrier/ZnSnOx/ZnO (8) growth layer. The net Mo (110) intensities at 0 tilt and 5 deg tilt were summed and the summed total expressed as a percentage of the total net intensity in the pole figure. The pole figures and intensities of these samples are shown in FIGS. 4 and 5 respectively. The sample on the ZnO growth layer was shown to have significantly greater columnar orientation than the sample on float.

Example 10

A further surprising aspect of this invention is that the crystallinity of the sample and intensity of the (110) peak are very much dependent on the ZnO thickness and that as this was increased beyond an optimum point, the intensity actually dropped. This was demonstrated by preparing a series of samples comprising a Float/SiO2 (30)/$ZnSnO_x$ (5)/ZnO/Mo (500) structure, wherein the thickness of the ZnO layer was varied across the series. The results of analysis are illustrated in FIGS. 6 and 7.

Figure 6:
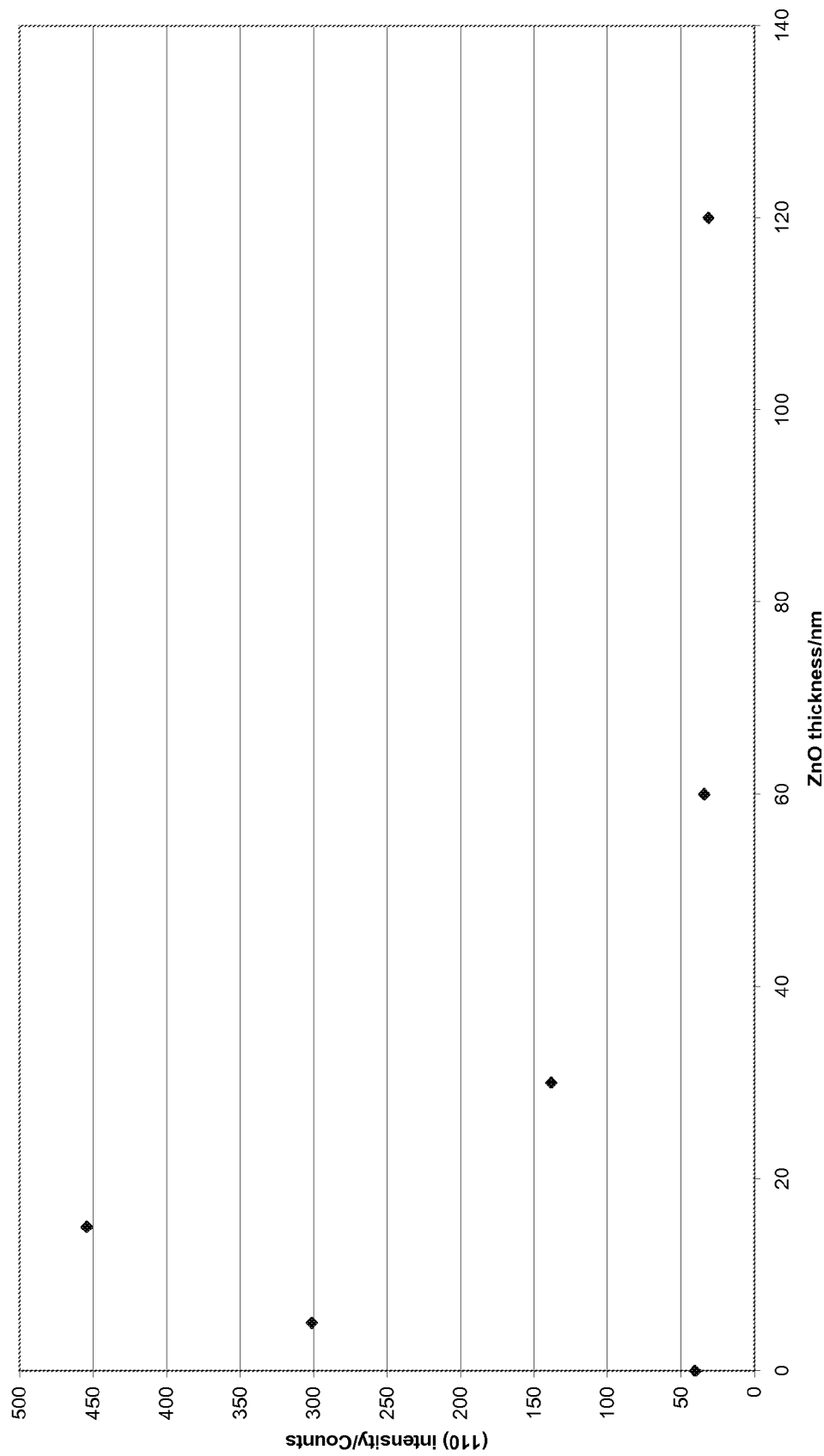
FIG. 6 illustrates the variation of (110) peak intensity with ZnO thickness for a range of samples of Mo grown according to the invention on a $SiO_2$ barrier layer.

FIG. 6 shows little improvement of the (110) peak intensity for coating thicknesses of 0 nm or 60 nm and above. However, a significant improvement is shown for any value between these two extremes and it is clear that the extent of the improvement depends heavily on the actual value within the range.

In particular, the steep region of the graph as the thickness increases from zero indicates a significant improvement for any coating thickness above zero. The improvement is especially marked between values of about 8 nm and 30 nm. The optimum thickness is in the range 12-18 nm.

Figure 7:
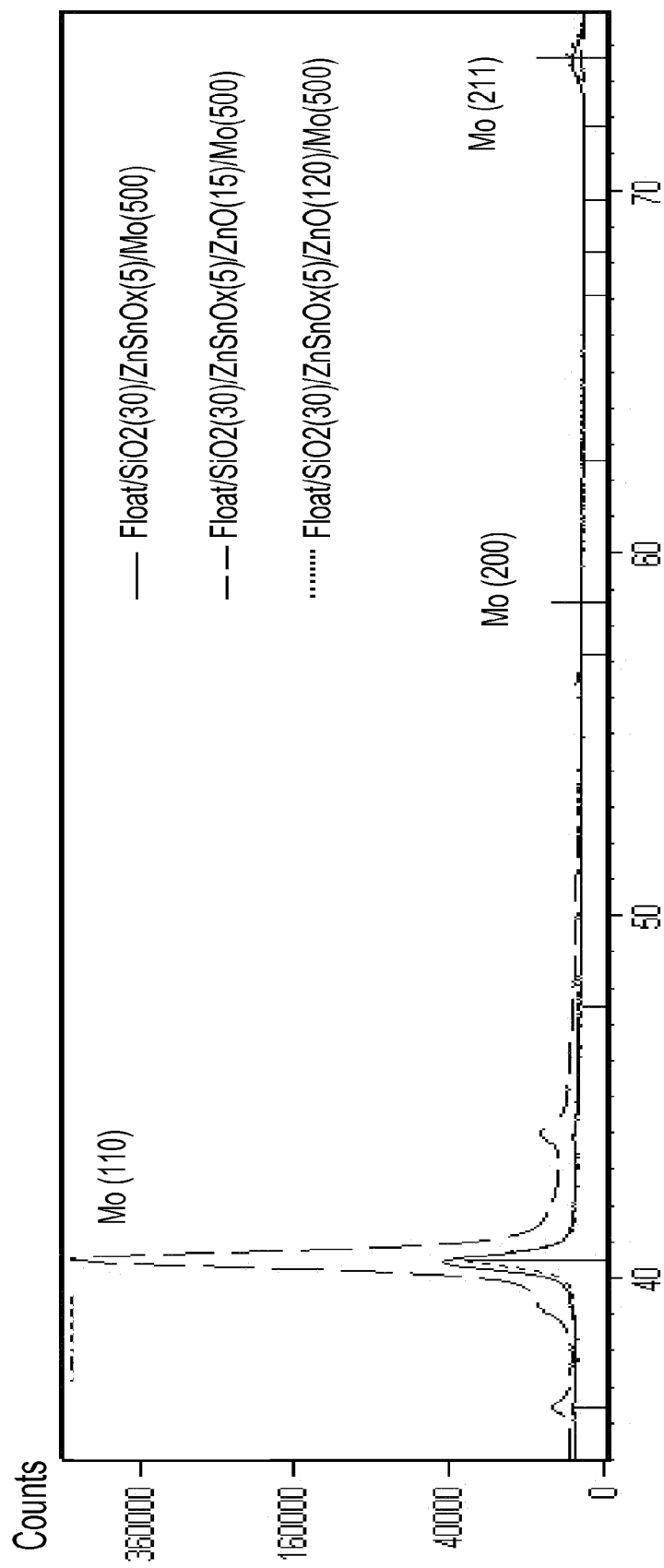
FIG. 7 shows the XRD pattern for a selection of the samples used to provide the data in FIG. 6

Selected XRD analysis data of these samples are shown in FIG. 7 (for clarity, only data for ZnO thicknesses of 0, 15 and 120 nm are shown).

Sheet resistance and durability remained constant as described previously and so the ZnO layer can be used as a tuning layer to obtain the optimum morphology of Mo for the relevant CIGS deposition process.

Example 11

Figure 8:
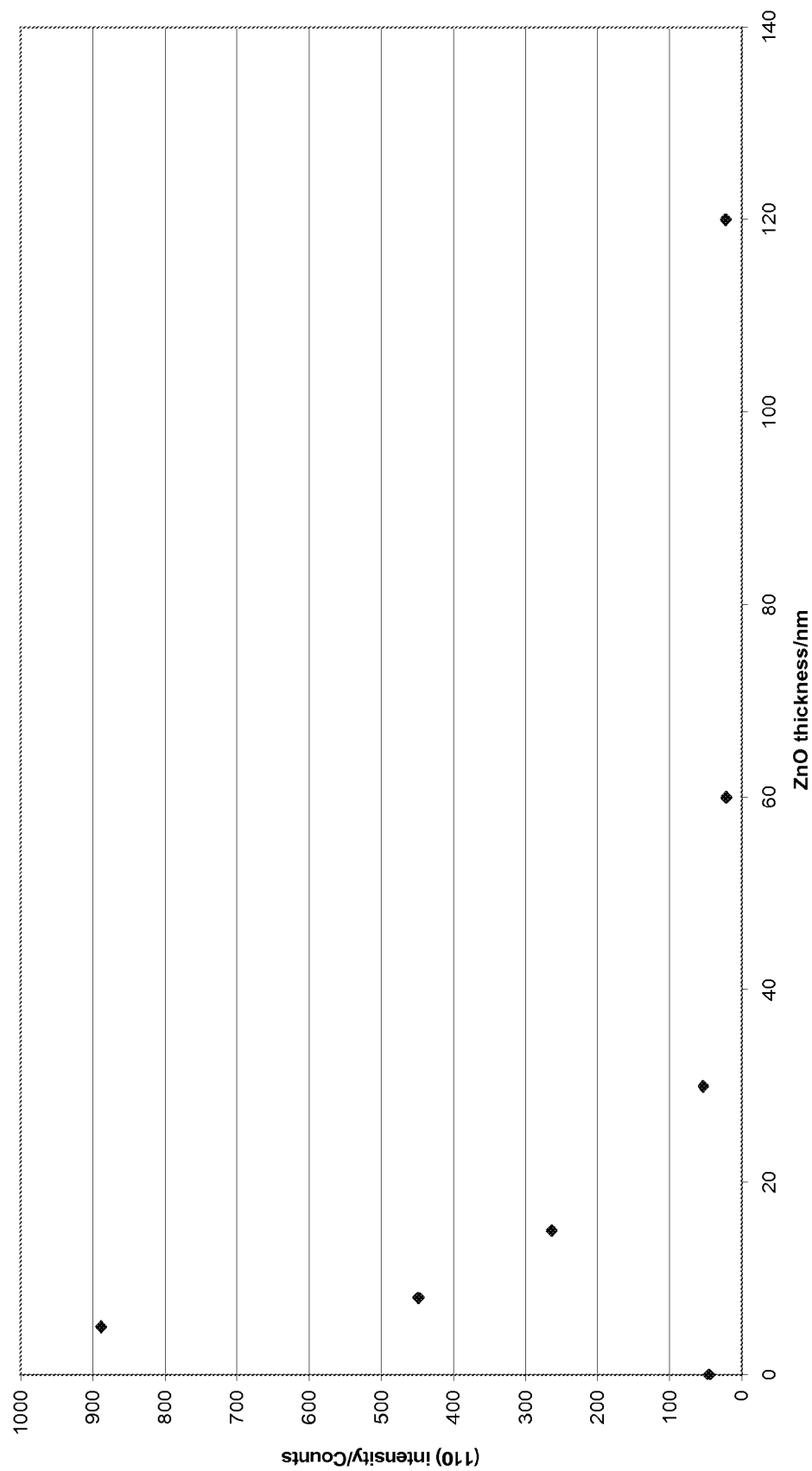
FIG. 8 illustrates the variation of (110) peak intensity with ZnO thickness for a range of samples of Mo grown according to the invention on a $Si_xN_y$ barrier layer.

In order to demonstrate that the benefits of the invention are not restricted to systems having an $SiO_2$ barrier layer, a series of samples comprising Float/SixNy (20)/ZnSnOx (5)/ZnO/Mo (500) was prepared. The variation of (110) peak intensity with ZnO thickness is shown in FIG. 8.

Again a significant improvement in (110) peak intensity is shown for thicknesses between 0 and 60 nm, with the degree of improvement depending heavily on the actual value of the thickness. Comparison of FIGS. 6 and 8 further reveals that the optimum thickness for the ZnO layer depends on the type of barrier layer: in FIG. 8, the improvement is especially marked for thicknesses between 0 and 30 nm, more so between values of between 0 and 15 nm. The optimum thickness is in the range 2-8 nm.

So, while the optimum thickness for the ZnO layer may vary according to the barrier layer used, it is clear that using ZnO layers that are thinner that the 150 nm or so suggested by the prior art will give rise to improvements in the Mo layer characteristics. Moreover, these characteristics may be finely tuned by selection of the precise thickness of the ZnO layer.

Examples 12-14

As previously noted, circumstances may occur in which a certain degree of sodium diffusion from a glass substrate is desirable. In examples 12-14, ZnSnOx layers of various thicknesses were deposited directly on the glass substrates followed by deposition of a ZnO layer.

As with previous samples, a 500 nm Mo layer was deposited on each of these and the results of analysis are shown in table 3.

TABLE 3

Properties of Mo layers grown on substrates having no sodium barrier layer

| Example | Description | (110) Intensity | FWHM (deg) | Crystallite size (nm) | Strain in Film (%) |
|---|---|---|---|---|---|
| 12 | Float/ZnSnOx(5)/ZnO(8) | 721 | 0.35 | 29.3 | 0 |
| 13 | Float/ZnSnOx(10)/ZnO(8) | 1938 | 0.3031 | 33.8 | 0.07T |
| 14 | Float/ZnSnOx(20)/ZnO(8) | 1270 | 0.3573 | 28.8 | 0.04T |

Table 3 indicates (inter alia) a high degree of (110) orientation among the Mo crystal, demonstrating that the invention works well with samples that do not include a sodium barrier layer.

Sample 12 shows an increased (110) presence for a ZnSnOx layer of 5 nm and this increases further and markedly for sample 13, which has a 10 nm ZnSnOx layer. For sample 14 (20 nm ZnSnOx), the (110) intensity is still high, but lower than that of sample 13.

So the data shown in table 3 indicates that deposition of Mo in the (110) orientation is still enhanced when no barrier layer is present. Moreover, an optimum thickness for a ZnSnOx layer (in terms of deposition of Mo in the (110) orientation) lies somewhere between 5 nm and 20 nm.

The invention claimed is:

1. A substrate bearing a stack of layers as the back contact in a molybdenum photovoltaic device, said back contact comprising in order from the substrate:
   a barrier layer comprising at least one of: $Si_xN_y$, $SiO_2$, $SnO_2$, SiCO and $TiO_2$;
   a primer layer;
   a layer of ZnO; and
   a layer of molybdenum, wherein the molybdenum is deposited directly on the layer of ZnO;
   the ZnO layer having a thickness, t, of 0 nm<t<50 nm;
   wherein the ZnO layer is deposited directly on the primer layer; and
   the primer layer is deposited directly on the barrier layer and comprises $TiO_2$ or $ZnSnO_x$.

2. The substrate according to claim 1, wherein the primer layer has a thickness of between 5 and 50 nm.

3. The substrate according to claim 1, wherein the substrate is glass.

4. The substrate according to claim 1, wherein the barrier layer comprises a sodium barrier layer.

5. The substrate according to claim 4, wherein the barrier layer has a thickness of between 5 and 200 nm.

6. The substrate according to claim 1, wherein the barrier layer comprises $SiO_2$.

7. The substrate according to claim 6, wherein 8 nm<t<30 nm.

8. The substrate according to claim 7, wherein 12 nm<t<18 nm.

9. The substrate according to claim 1, wherein the barrier layer comprises $Si_xN_y$.

10. The substrate according to claim 9, wherein 0 nm<t<30 nm.

11. The substrate according to claim 10, wherein 0 nm<t<15 nm.

12. The substrate according to claim 11, wherein 2 nm<t<8 nm.

13. The substrate according to claim 1, wherein the primer layer comprises a layer of $ZnSnO_x$ having a thickness of between 5 and 30 nm.

14. The substrate according to claim 1, wherein the ZnO layer comprises a component of Al.

15. The substrate according to claim 1, incorporated in a photovoltaic cell.

16. A substrate bearing a stack of layers as the back contact in a molybdenum photovoltaic device, said back contact comprising in order from the substrate:
   a barrier layer;
   a layer of ZnO; and
   a layer of molybdenum, wherein the molybdenum is deposited directly on the layer of ZnO;
   the ZnO layer having a thickness, t, of 0 nm<t<50 nm;
   wherein the ZnO layer is deposited directly on the barrier layer; and
   the barrier layer comprises at least one of: $SnO_2$, SiCO and $TiO_2$.

17. The substrate according to claim 16, incorporated in a photovoltaic cell.

18. A method of controlling the crystal orientation of a molybdenum layer on a substrate comprising the steps of:
   depositing a barrier layer comprising at least one of: $Si_xN_y$, $SiO_2$, $SnO_2$, SiCO and $TiO_2$ on the substrate,
   depositing a primer layer comprising $TiO_2$ or $ZnSnO_x$ directly on the barrier layer,
   depositing a layer of ZnO directly on the primer layer, and
   depositing a layer of molybdenum directly on the layer of ZnO;
   wherein a thickness, t, for the ZnO layer is selected according to the desired crystal orientation wherein 0 nm<t<50 nm.

19. The method according to claim 18, wherein the primer layer has a thickness of between 0 and 50 nm.

20. The method according to claim 18, wherein the substrate is glass.

21. The method according to claim 20, wherein the barrier layer comprises a sodium barrier layer on the glass prior to deposition of any other layer.

22. The method according to claim 21, wherein a thickness is selected for the barrier layer of between 5 and 200 nm.

23. The method according to claim 21, wherein the barrier layer is deposited by chemical vapour deposition.

24. The method according to claim 18, wherein the barrier layer comprises a layer of $SiO_2$.

25. The method according to claim 24, wherein 8 nm<t<30 nm.

26. The method according to claim 25, wherein 12 nm<t<18 nm.

27. The method according to claim 18, wherein the barrier layer comprises a layer of $Si_xN_y$.

28. The method according to claim 27, wherein 0 nm<t<30 nm.

29. The method according to claim 28, wherein 0 nm<t<15 nm.

30. The method according to claim 29, wherein 2 nm<t<8 nm.

31. The method according to claim 18, wherein the primer layer comprises a layer of $ZnSnO_x$ having a thickness of between 5 and 30 nm.

32. The method according to claim 18, wherein the ZnO layer comprises a component of Al.

* * * * *